(12) United States Patent
Kondo et al.

(10) Patent No.: US 8,982,611 B2
(45) Date of Patent: Mar. 17, 2015

(54) MAGNETIC MEMORY ELEMENT AND MAGNETIC MEMORY APPARATUS

(75) Inventors: Tsuyoshi Kondo, Kanagawa-ken (JP);
Hirofumi Morise, Kanagawa-ken (JP);
Shiho Nakamura, Kanagawa-ken (JP);
Junichi Akiyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 412 days.

(21) Appl. No.: 13/526,961

(22) Filed: Jun. 19, 2012

(65) Prior Publication Data

US 2013/0077396 A1 Mar. 28, 2013

(30) Foreign Application Priority Data

Sep. 26, 2011 (JP) .................................. 2011-209987

(51) Int. Cl.
*G11C 11/00* (2006.01)
*G11C 11/16* (2006.01)

(52) U.S. Cl.
CPC ......... *G11C 11/1673* (2013.01); *Y10S 977/933* (2013.01); *Y10S 977/935* (2013.01)
USPC ........... 365/158; 365/148; 365/171; 977/933; 977/935

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 257/421, 257/E21.665; 438/3; 977/933–935
See application file for complete search history.

(56) References Cited

U.S. PATENT DOCUMENTS

| 7,471,491 | B2* | 12/2008 | Sato et al. ..................... 360/313 |
| 7,813,087 | B2* | 10/2010 | Sato et al. .................. 360/324.1 |
| 7,817,375 | B2* | 10/2010 | Sato et al. ................ 360/125.31 |
| 8,625,335 | B2* | 1/2014 | Morise et al. ................. 365/157 |
| 2005/0219771 | A1* | 10/2005 | Sato et al. .................. 360/324.2 |
| 2009/0097167 | A1* | 4/2009 | Sato et al. ..................... 360/324 |
| 2009/0097169 | A1* | 4/2009 | Sato et al. .................. 360/324.2 |
| 2012/0224416 | A1 | 9/2012 | Kondo et al. |
| 2012/0250398 | A1* | 10/2012 | Morise et al. ................. 365/157 |

FOREIGN PATENT DOCUMENTS

JP 2009-021352 1/2009

* cited by examiner

*Primary Examiner* — Harry W Byrne
(74) *Attorney, Agent, or Firm* — Amin, Turocy & Watson, LLP

(57) ABSTRACT

A magnetic memory element includes a first magnetic layer, a second magnetic layer, a first intermediate layer, a first magnetic wire, a first input unit, and a first detection unit. The first magnetic layer has magnetization fixed. The second magnetic layer has magnetization which is variable. The first intermediate layer is between the first magnetic layer and the second magnetic layer. The first magnetic wire extends in a first direction perpendicular to a direction connecting from the first magnetic layer to the second magnetic layer and is adjacent to the second magnetic layer. In addition, write-in is performed by propagating a first spin wave through the first magnetic wire and by passing a first current from the first magnetic layer toward the second magnetic layer. Read-out is performed by passing a second current from the first magnetic layer toward the second magnetic layer.

7 Claims, 20 Drawing Sheets

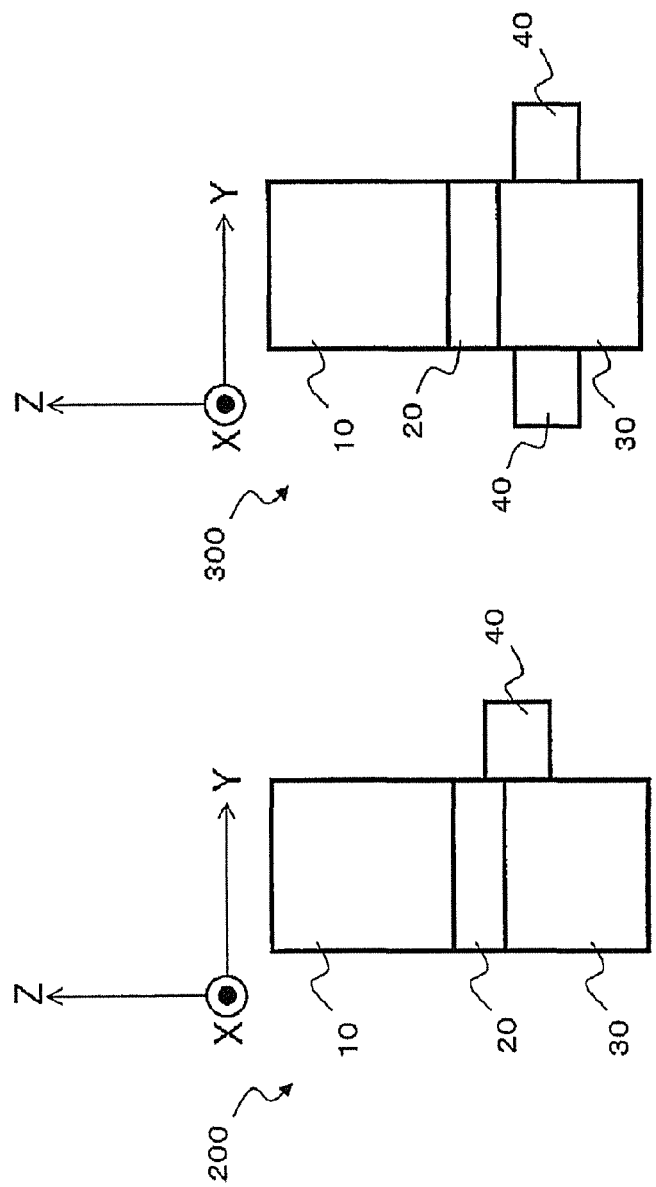

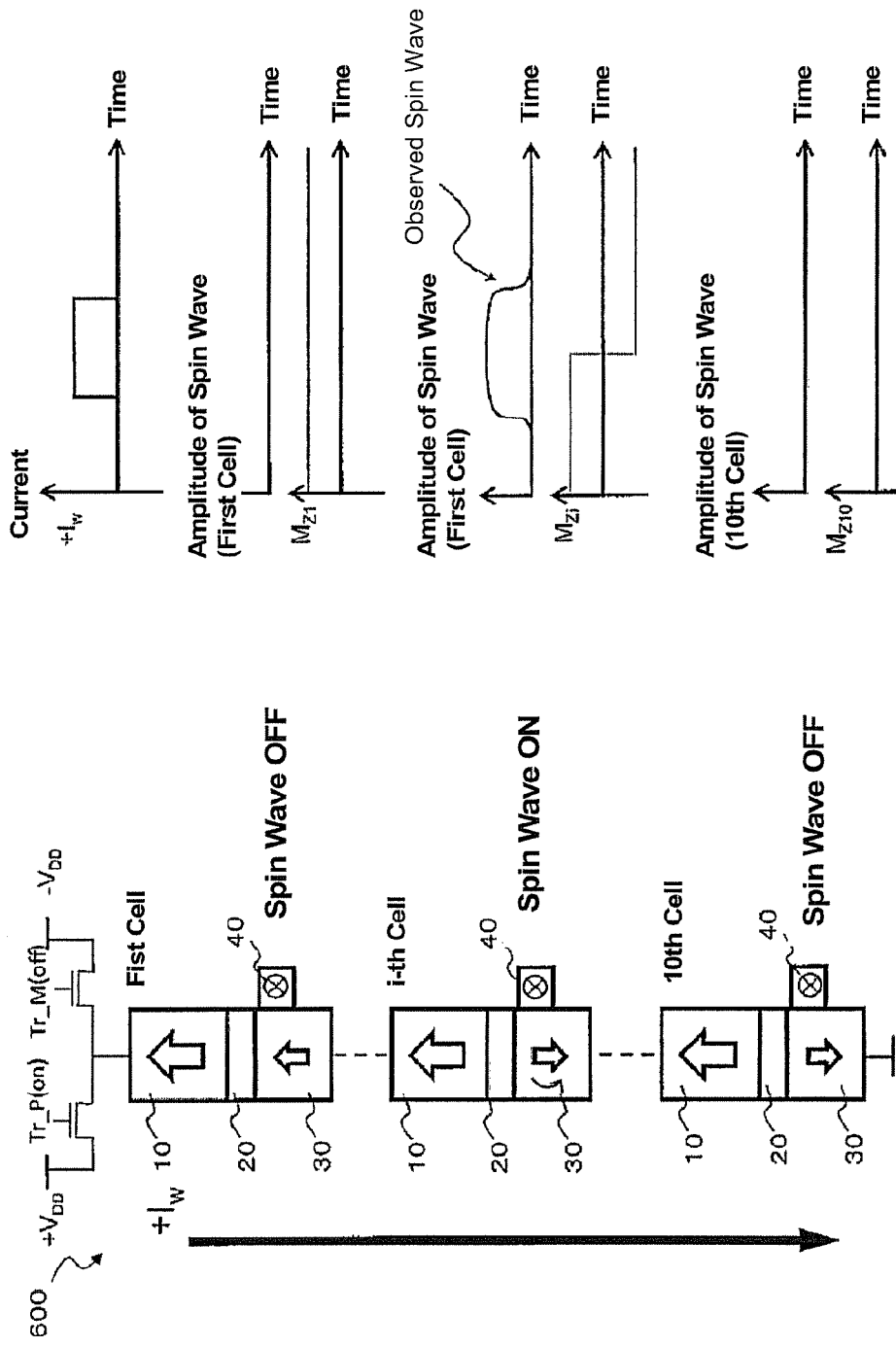

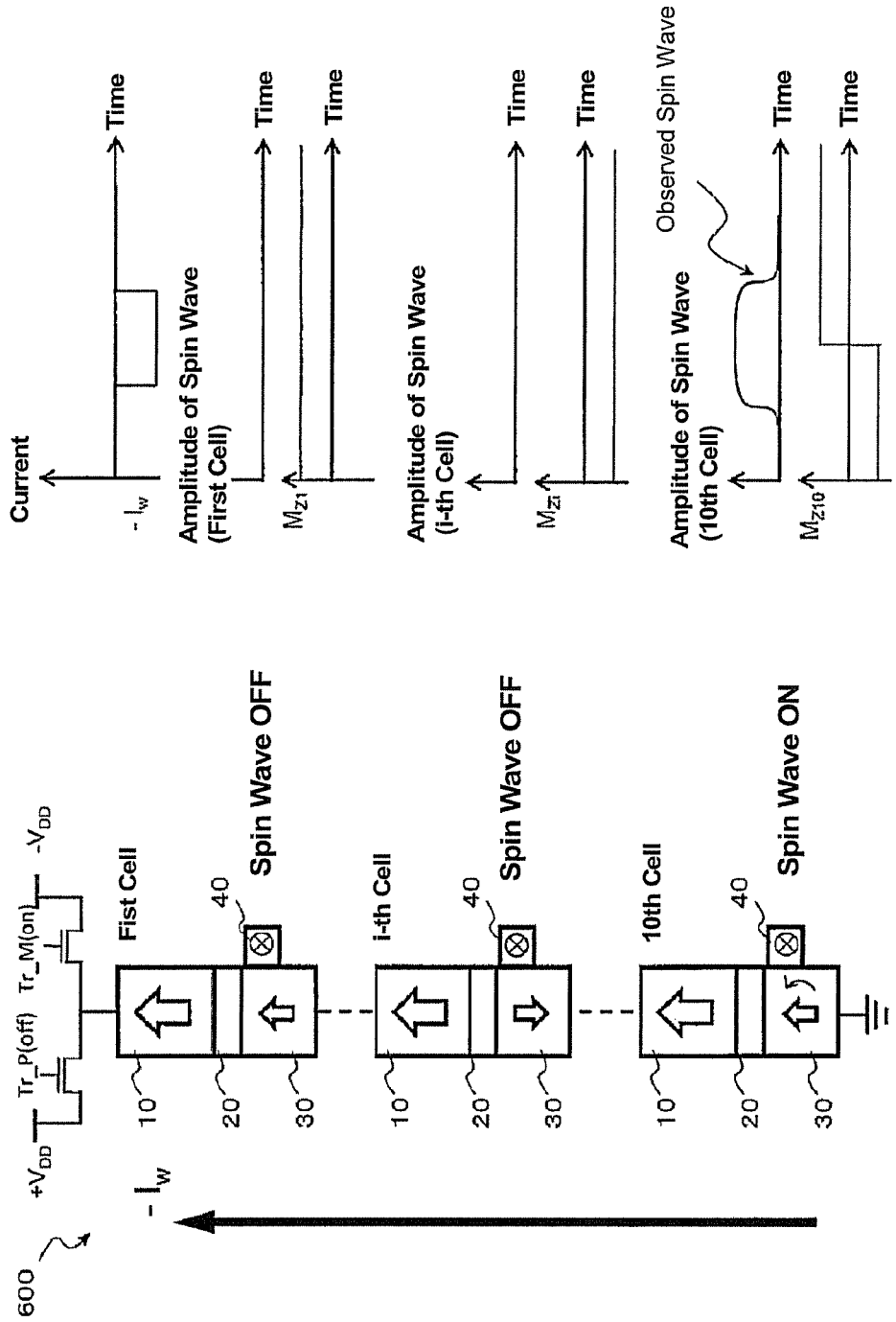

MAGNETIC MEMORY ELEMENT AND MAGNETIC MEMORY APPARATUS

CROSS REFERENCE TO RELATED APPLICATION

This application is based upon and claims the benefit of priority from the prior Japanese Patent Application No. 2011-209987, filed on Sep. 26, 2011, the entire contents of which are incorporated herein by reference.

FIELD

Embodiments relate basically to a magnetic memory element and a magnetic memory apparatus.

BACKGROUND

There is magnetic random access memory (MRAM) as one of various memories. MRAM uses a ferromagnetic material for a part for recording information represented with a magnetization direction of the ferromagnetic material, thereby enabling long-term storing of the information. On the MRAM one switches magnetization direction for recording information by applying a magnetic field or injecting a spin-polarized current.

BRIEF DESCRIPTION OF THE DRAWINGS

Aspects of this disclosure will become apparent upon reading the following detailed description and upon reference to the accompanying drawings.

FIGS. 14A and 14B are views showing modifications of the magnetic memory element.

FIGS. 18A and 18B are views to explain write-in of the magnetic memory apparatus.

FIGS. 19A and 19B are views to explain write-in of the magnetic memory apparatus.

DESCRIPTION

Figure 1:
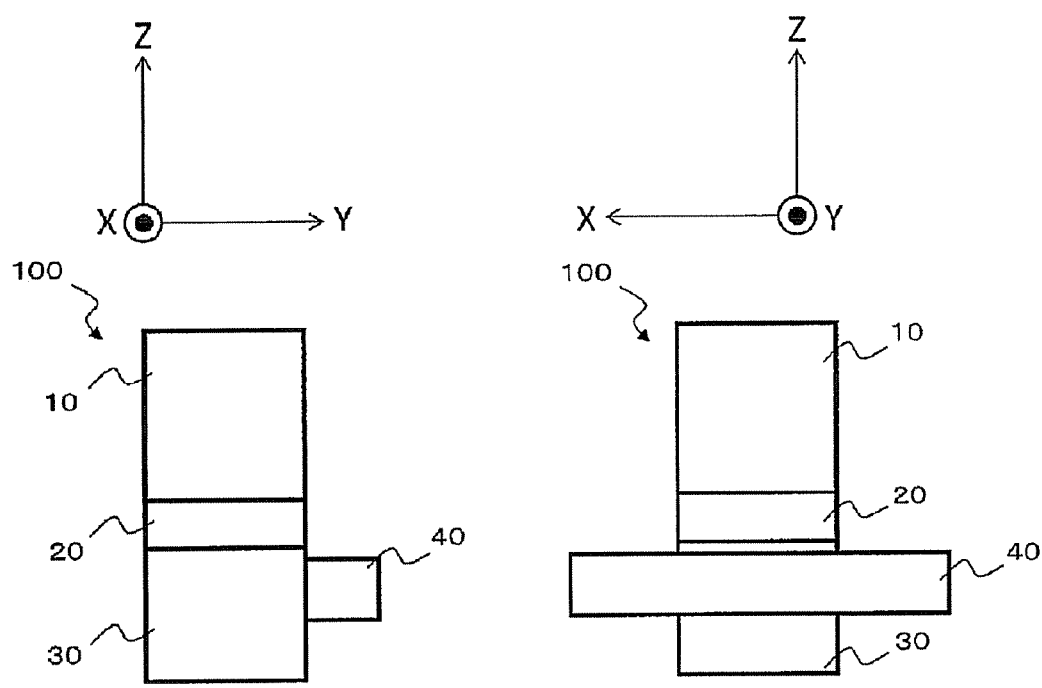
FIG. 1 is a view showing a magnetic memory element in accordance with a first embodiment.

As will be described below, in accordance with an embodiment, a magnetic memory element includes a first magnetic layer, a second magnetic layer, a first intermediate layer, a first magnetic wire, a first input unit, and a first detection unit. Magnetization direction of the first magnetic layer is fixed. Magnetization direction of the second magnetic layer is variable. The first intermediate layer is located between the first magnetic layer and the second magnetic layer. The first magnetic wire extends in a first direction perpendicular to a direction connecting from the first magnetic layer to the second magnetic layer and is adjacent to the second magnetic layer. The first input unit is provided at one end of the first magnetic wire. The first detection unit is provided at another end of the first magnetic wire. Write-in operation is performed by using a first spin wave propagating through the first magnetic wire, and by using a first current passing from the first magnetic layer toward the second magnetic layer. Magnetization direction of the second magnetic layer is reversed with the first spin wave and the first current. Read-out operation is performed by using a second current passing from the first magnetic layer toward the second magnetic layer. The second current causes magnetization of the second magnetic layer to precess, generates a second spin wave in the first magnetic wire. The second spin wave propagates through the first magnetic wire And then, it is detected in the first detection unit.

The embodiments will be described with reference to the drawings. Wherever possible, the same reference numerals or marks will be used to denote the same or like portions throughout the drawings. The drawings are conceptual views. Therefore, a relationship between the thickness and width of each portion or a proportionality factor among respective portions in the views is not necessarily equal to that in an actual product. Even when the same portions are drawn, their sizes or proportionality factors are represented differently from each other depending on the drawings.

First Embodiment

FIG. 1 is a view showing a magnetic memory element (also referred to as a magnetic memory "cell") 100 in accordance with a first embodiment.

The magnetic memory element 100 is provided with a reference layer (a first magnetic layer) 10, an intermediate layer 20, a free layer (a second magnetic layer) 30, and a magnetic wire 40.

As shown in FIG. 1, the x-axis, the y-axis, and the z-axis are normal to one another. The z-axis direction is the lamination direction and normal to the x- and y-axes directions. The left and right figures in FIG. 1 show the magnetic memory element 100 viewed from the x-axis direction and the y-axis direction, respectively.

The reference layer 10, the intermediate layer 20, and the free layer 30 are laminated in the z-axis direction.

The magnetic wire is adjacent to the free layer 30 and extends in the x-direction.

The reference layer 10 and the free layer 30 include a ferromagnetic material, a ferrimagnetic material, or an artificial lattice.

The ferromagnetic material can be an alloy containing the following: at least one element selected from the group consisting of iron (Fe), cobalt (Co), nickel (Ni), manganese (Mn), and chromium (Cr); and at least one element selected from the group consisting of platinum (Pt), palladium (Pd), iridium (Ir), ruthenium (Ru), and rhodium (Rh). Examples of the alloy include CoPt, NiFe, and CoCrPt. The characteristics of the ferromagnetic material can be controlled by changing the composition, heat treatment, etc.

The ferrimagnetic material can be an amorphous alloy of rare-earth and transition metals, such as TbFeCo and GdFeCo. A film of the alloy is formed by sputtering under specific conditions so that the magnetization of the film tends to be oriented in the z-axis direction. The film characteristic is suitable to obtain perpendicular magnetization.

The laminated structures, which include Co/Ni Co/Pt, and Co/Pd, can be employed for the artificial lattice. The laminated structures allow it to align the magnetization in the z-axis direction. The laminated structures easily have a hexagonal close-packed structure in a <0001> orientation or a face-centered cubic structure in a <111> orientation.

The magnetization direction of the reference layer 10 is fixed in the lamination direction. The thickness of reference layer 10 is not less than 10 nm and not more than 50 nm. A current passing through the magnetic memory 100 generates spin torque in the free layer 30. A reaction due to the spin torque possibly may change the magnetization direction of the reference layer 10. For this reason, it is preferred that a damping factor of the reference layer 10 is larger than that of the free layer 30. The larger damping factor for the reference layer 10 elongates a time needed for the magnetization reversal of the reference layer 10 due to the spin torque. The magnetization reversal of the reference layer 10 with the larger damping factor is insensitive to the current passing through the magnetic memory 100 if a time, in which the current passes, is short.

The magnetization direction of the free layer 30 is fixed less tightly than that of the reference layer 10. The magnetization direction of the free layer 30 is rotatable to a few degree (described also as being "variable"). The magnetization of the free layer 30 points to the lamination direction. The thickness of free layer 30 is not less than 2 nm and not more than 20 nm.

The intermediate layer 20 is provided between the reference layer 10 and the free layer 30, thereby allowing the two magnetization directions of the reference layer 10 and the free layer 30 to be independent each other. A conductive material can be used for the intermediate layer 20. As the conductive material, at least one element selected from the group consisting of copper (Cu), gold (Au), silver (Ag), and aluminum (Al) can be used, for example. Alternatively, these elements may be alloyed with each other. The thickness of intermediate layer 20 is not less than 1.5 nm and not more than 20 nm.

The magnetic wire 40 is a line for propagation of a spin wave. Materials of the magnetic wire 40 include a ferromagnetic material, a ferrimagnetic material, and a ferrimagnetic insulator oxide.

The following alloys can be used for the ferromagnetic material. The alloy contains at least one element selected from the group consisting of iron (Fe), cobalt (Co), nickel (Ni), manganese (Mn), and chromium (Cr); and at least one element selected from the group consisting of platinum (Pt), palladium (Pd), iridium (Ir), ruthenium (Ru), and rhodium (Rh). Examples of the alloy include CoPt, NiFe, and CoCrPt. The characteristic of the alloys can be controlled by changing the composition thereof and heat treatment, etc.

Amorphous alloys of rare earth metal and transition metal can be used as ferrimagnetic materials. The amorphous alloys include TbFeCo and GdFe Co.

Ferrite ($M\text{-}Fe_2O_4$) having a spinel structure or rare earth iron Garnett ($R_3\text{—}Fe_5O_{12}$) can be used as a ferrimagnetic material of insulating oxide. M is one element selected from the group consisting of manganese (Mn), iron (Fe), cobalt (Co), nickel (Ni), copper (Cu), and magnesium (Mg); or the combination of at least two elements selected therefrom. R is one or two elements selected from the group consisting of yttrium (Y), samarium (Sm), europium (Eu), gadolinium (Gd), terbium (Tb), dysprosium (Dy), holmium (Ho), erbium (Er), thulium (Tm), ytterbium (Yb), and lutetium (Lu). Alternatively, aluminum (Al) may be added to the rare earth iron Garnett.

The magnetization of the magnetic wire 40 points to the longitudinal direction of the magnetic wire 40 as a result of shape anisotropy. The magnetization direction can be controlled by changing the composition and heat treatment.

The operation principle of the magnetic memory element 100 will be described below.

FIG. 2 is a view to explain behavior of the magnetization of the reference layer 10 and the magnetization of the free layer 30. The view assumes that a current passes through the magnetic memory element 100 under the same conditions including the magnitude and passing time of the current.

Figure 2A:
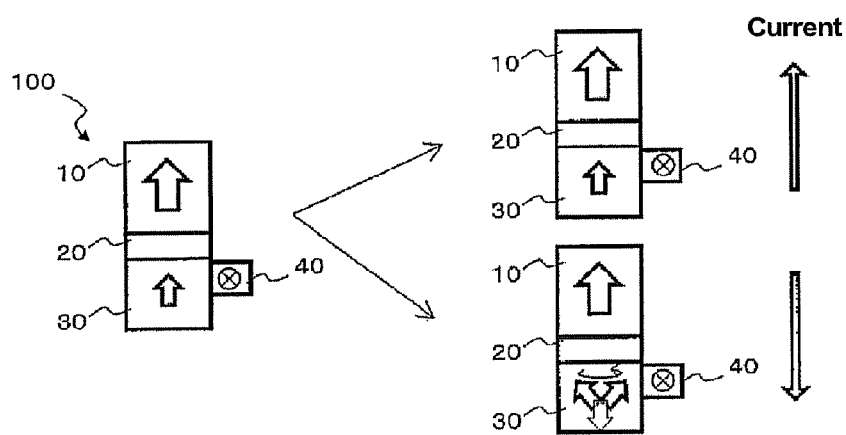
FIG. 2 is a view to explain behavior of magnetization of a reference layer and magnetization of a free layer.
Figure 2B:
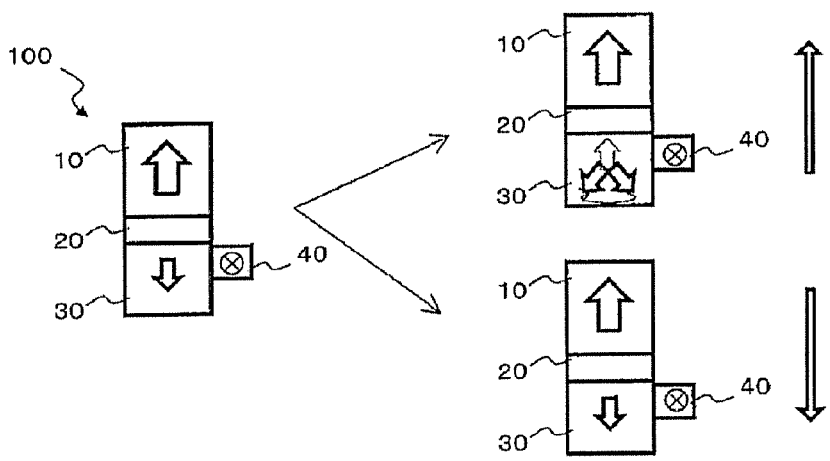

In FIG. 2A, the magnetization of the reference layer 10 and the magnetization of the free layer 30 points to upward (in the z-axis direction) of the drawing. The magnetization is oriented perpendicularly to the lamination direction of the magnetic memory element 100. Directions of the magnetization of the reference layer 10 and the magnetization of the free layer 30 are parallel to each other. This state will be referred to as a "parallel magnetization arrangement." In FIG. 2B, directions of the magnetization of the reference layer 10 and the magnetization of the free layer 30 are oriented upward and downward, respectively. The magnetization of the reference layer 10 and the magnetization of the free layer 30 are anti-parallel to each other. This anti-parallel state will be referred to as an "anti-parallel magnetization arrangement."

Even when a current is passed from the free layer 30 toward the reference layer 10 through the magnetic memory element 100 in the parallel magnetization arrangement, spin torque acting on the magnetization of the free layer 30 is hardly generated. As a result, the magnetization direction of the free layer 30 hardly changes (see the upper right figure of FIG. 2A). In contrast, the current passes from the reference layer 10 towards the free layer 30 to perform spin injection from the reference layer 10. The spin injection generates spin torque to reverse the magnetization of the free layer 30. A sufficiently large current reverses the magnetization of the free layer 30 completely as a result of the spin torque generated (see the lower right figure of FIG. 2A).

The magnetic memory element 100 in the anti-parallel magnetization arrangement shows behavior contrast to the behavior of the magnetic memory element 100 in the parallel magnetization arrangement. Passing a current from the reference layer 10 towards the free layer 30 does not reverse the magnetization of the free layer 10. In contrast, passing a current from the free layer 30 towards the reference layer 10 generates spin injection from the reference layer 10 to reverse the magnetization of the free layer 30.

Figure 3A:
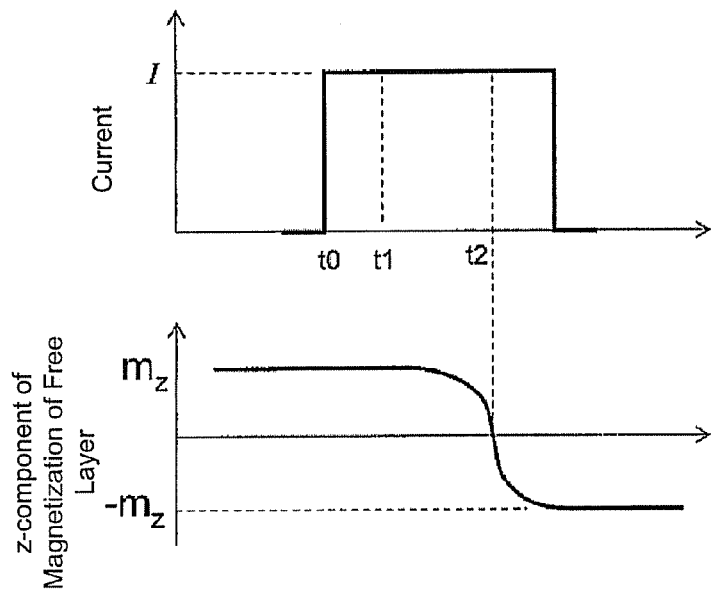
FIGS. 3A and 3B are views to explain magnetization reversal in the free layer versus time.
Figure 3B:
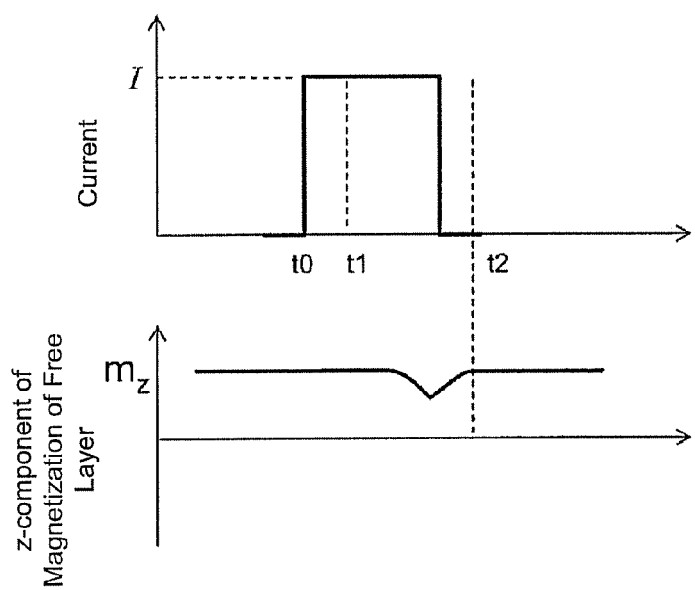

FIGS. 3A and 3B are views to explain the magnetization reversal in the free layer 30 versus time.

The horizontal axes denote time. The time $t_0$ denotes a time to start passing a current. The vertical axes of the upper drawings of FIGS. 3A and 3B denote the magnitude of the current I. The vertical axes of the upper drawings of FIGS. 3A and 3B denote the z-component $m_z$ of the magnetization of the free layer 30. "$m_z$" denotes an upward magnetization direction in the drawings. "$-m_z$" denotes a downward magnetization direction in the drawings. The magnetic memory element 100 is assumed to be in the parallel magnetization arrangement (see FIG. 2A).

When no current passes through the free layer 30, the magnetization of the free layer 30 changes a little bit as a result of thermal fluctuation. Passing a current through the free layer 30 generates spin torque acting on the magnetization thereof, which changes little by little. The spin torque induces a precession of the magnetization of the free layer 30 around a rotation axis in the z-axis direction. The time $t_1$ denotes the starting time of the precession. By passing of time, the amplitude of the precession increases, and then the magnetization of free layer 30 results in reversing (see FIG. 3A). The time $t_2$ denotes a middle time between the starting and ending times of the magnetization reversal. A threshold current is required for the magnetization reversal in the free layer 30. A current exceeding the threshold current reverses the magnetization of the free layer 30. When a current more than the threshold current passes therethrough, the time interval between $t_1$ and $t_2$ shortens.

When a current more than the threshold current passes therethrough, stopping the current feed before the time $t_2$ causes no magnetization reversal in the free layer 30. The magnetic memory element 100 returns to the parallel magnetization arrangement (see FIG. 3B).

Write-in operation of the magnetic memory element 100 will be described below.

Data of "0" and "1" are assigned to the parallel magnetization arrangement and the anti-parallel magnetization arrangement, respectively. By passing a current larger than the threshold value from the reference layer 10 toward the free layer 30 over the time $t_2$, one changes the data from "0" to "1." In contrast, by passing a current larger than the threshold from the free layer 30 toward the reference layer 10 over the time $t_2$, one changes the data from "1" to "0." This current is referred to as "−I."

For an example, one can generate a spin wave inside the magnetic wire 40, by applying alternating magnetic field to one end of the magnetic wire 40. The spin wave is a phenomenon that the precession of magnetization propagates through the magnetic wire 40. The propagation of the spin wave generates magnetic poles on the surface of the magnetic wire 40. The magnetic poles generate alternating magnetic fields outside the magnetic wire 40. The alternating magnetic fields due to the spin wave are applied to the free layer 30 when the magnetic wire 40 is adjacent to the free layer 30 as shown in FIGS. 1A and 1B.

When the direction of spins injected into the free layer 30 and the magnetization direction of the free layer 30 are completely parallel or anti-parallel (collinear state), no spin torque is generated so that the magnetization of the free layer 30 is not reversed. On the other hand, the magnetization of the reference layer 10 and the magnetization of the free layer 30 constantly change their directions a little bit as a result of thermal fluctuation. Passing a current through the magnetic memory element 100 incidentally generates spin torque acting on the magnetization of the free layer 30 that starts a precession (time $t_1$). As a result, the magnetization of the free layer 30 is reversed (time $t_2$).

Figure 4A:
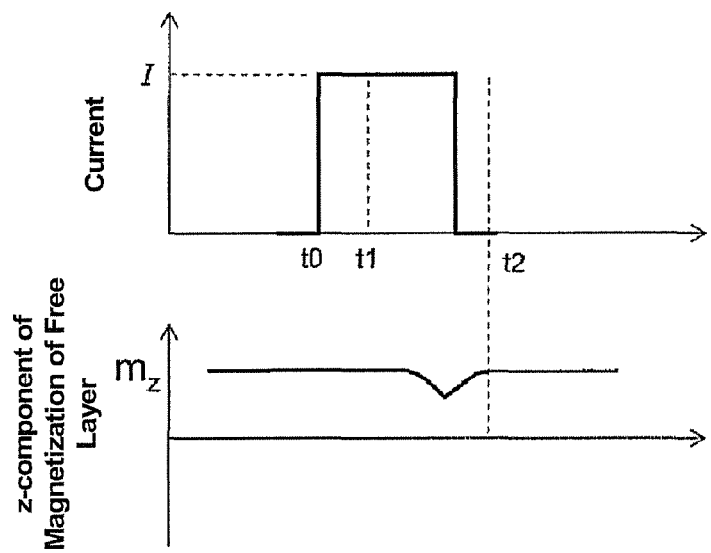
FIGS. 4A and 4B are views to explain the magnetization reversal of the free layer with and without a spin wave in a magnetic wire.
Figure 4B:
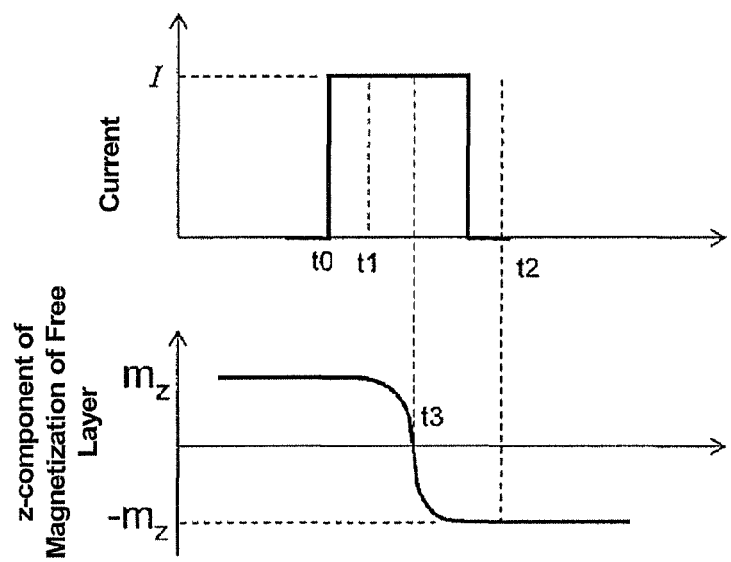

FIGS. 4A and 4B are views to explain magnetization reversal of the free layer 30 with and without a spin wave in the magnetic wire 40.

If the current I is turned off before the time $t_2$ for the free layer 30 to undergo magnetization reversal, the free layer 30 does not reverse as shown in FIG. 4A.

The magnetic memory element 100 is provided with the magnetic wire 40 to apply an alternating magnetic field to the free layer 30. The magnetic wire 40, in which spin wave is propagating, can give energy larger than thermal fluctuation energy to the free layer 30 before the current is passed through the magnetic memory element 100. The magnetization direction of the free layer 30 changes more greatly by the alternating magnetic field from the magnetic wire 40 than by thermal fluctuation. In other words, when a spin wave is propagated through the magnetic wire 40 before a current is passed through the magnetic memory element 100, the spin wave allows it to shorten the interval between the time $t_1$ and the time $t_2$. Here, the time $t_1$ and the time $t_2$ are the starting and ending times for the precession of magnetization of the free layer 30, respectively. In the above explanation, the magnetic memory element 100 has been in the parallel magnetization arrangement. When the magnetic memory element 100 is in the anti-parallel magnetization arrangement, the magnetic memory element 100 behaves the same way as in the parallel magnetization arrangement by passing the current, having the opposite direction as being denoted by −I.

Read-out operation of the magnetic memory element 100 will be described below.

The magnetization reversal process of the free layer 30 involves a precession of magnetization. The precession of magnetization generates an alternating magnetic field around the free layer 30. The alternating magnetic field, applied to the magnetic wire 40, generates a spin wave inside the magnetic wire 40. When a current is passed through the magnetic memory element 100, the magnetization state of the magnetic memory element 100 can be read out by detecting whether or not a spin wave is generated inside the magnetic wire 40. When a current of +I passes through the magnetic memory element 100, a spin wave is generated inside the magnetic wire 40 for the parallel magnetization arrangement but not generated thereinside for the anti-parallel magnetization arrangement.

The time, for which the current passes through the magnetic memory element 100 to carry out the read-out operation, is shorter than the time $t_2$. This is to prevent unintended magnetization reversal of the free layer 30. Preferably, the magnitude of a read-out current is smaller than the magnitude of a write-in current and larger than the current for reversing the magnetization of the free layer 30, in order to provide a design margin to the time for which the current passes therethrough.

Figure 5:
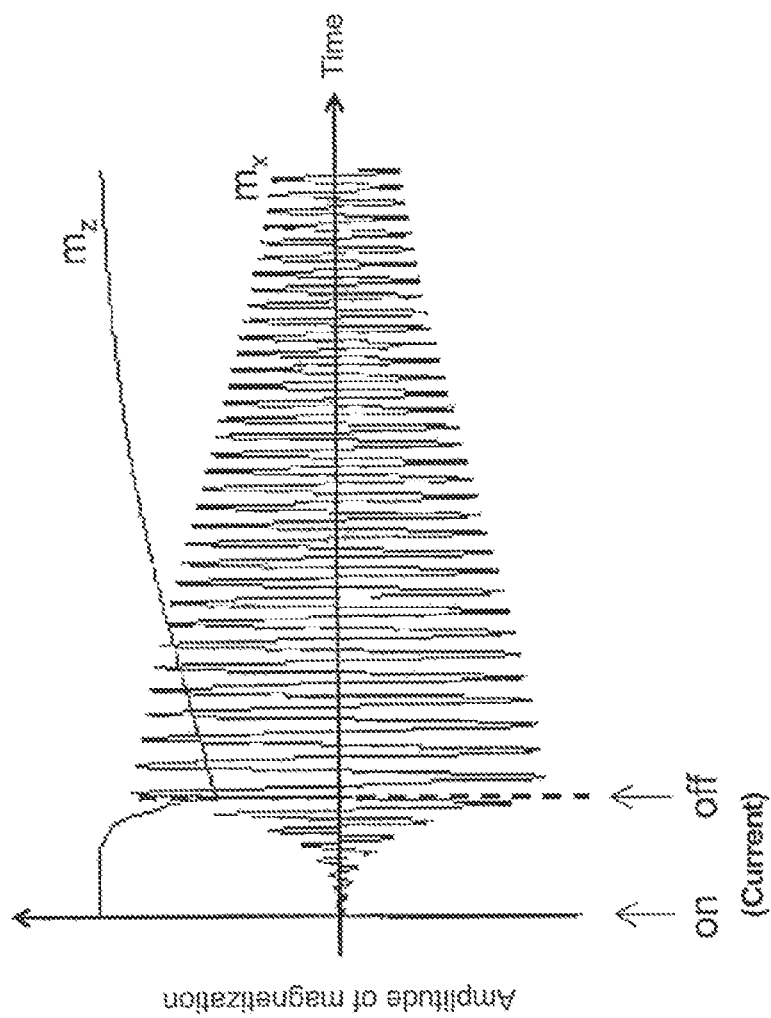
FIG. 5 is a view to explain behavior of the magnetization of the free layer.

FIG. 5 is a view to explain behavior of the magnetization of the free layer 30. The vertical axis denotes the amplitude of magnetization. The horizontal axis denotes time. The magnetization component $m_z$ denotes the magnetization direction that is either one of the upward and downward directions both lying in the lamination direction. The magnetization component $m_x$ denotes the magnetization direction that is either one of the leftward and rightward directions both lying in the plane of the paper. Passing a current through the free layer 30 vibrates $m_x$ greatly until the current passing therethrough is cut off. The current swings $m_z$ downward. Cutting off the current attenuates the vibration of $m_x$. Even though $m_z$ is swinging downward at that time, $m_z$ returns to its initial state. In other words, a certain amount of time is required to reverse the magnetization $m_z$ of the free layer 30.

Alternatively, a precession of the magnetization may be resonantly excited in the free layer 30 by propagating a spin wave through the magnetic wire 40 prior to passing a current through the magnetic memory element 100 so that the magnetization can stably precess in the free layer 30. This is to reduce instabilities in read-out operation caused by thermal fluctuation.

Figure 6A:
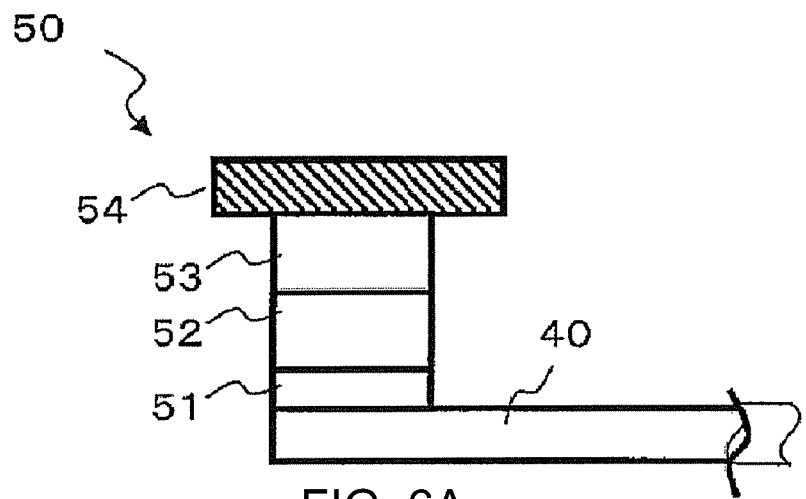
FIGS. 6A and 6B are views showing detection units both connected to the magnetic wire.
Figure 6B:
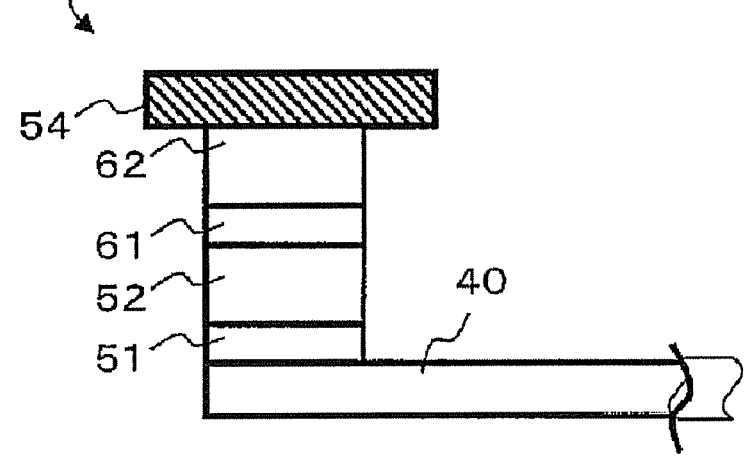

FIGS. 6A and 6B are views showing detection units (also referred to as spin-wave detection units) 50 and 60 both connected to the magnetic wire 40. FIG. 6A shows the detection unit 50. FIG. 6B shows the detection unit 60. The detection units 50 and 60 are identical in operation-principle but different in configuration.

The detection unit 50 is provided with a nonmagnetic layer 51 on the magnetic wire 40, a ferromagnetic layer 52, an antiferromagnetic layer 53, and an electrode 54.

Materials of the nonmagnetic layer 51 include Ta, Ru, Pt, Pd, Ir, Cu, Au, Ag, Cr, and Al. The materials may be alloys containing two or more of these elements. Alternatively, the materials may be alloys alloying at least one of these elements with other elements. Alternatively, the materials may include a laminated structure of these elements. Furthermore, the materials include MgO, alumina ($Al_2O_3$), and $SiO_2$, i.e., nonmagnetic insulators.

The ferromagnetic layer 52 has magnetization that is oriented in the lamination direction. Materials of the ferromagnetic layer 52 include FeVPd, FeCrPd, and CoFePt. In other words, alloys can be used for the ferromagnetic layer 52, containing at least one element selected from the group consisting of iron (Fe), cobalt (Co), nickel (Ni), manganese (Mn), and chromium (Cr); and at least one element selected from the group consisting of platinum (Pt), palladium (Pd), iridium (Ir), ruthenium (Ru), and rhodium (Rh). The characteristics of the alloys can be controlled by its compositions and heat treatment. Amorphous alloys of rare earth-transition metals including TbFeCo and GdFeCo; and laminated structures including Co/Pt, Co/Pd, and Co/Ni are preferred. Furthermore, Co/Ru, Fe/Au, and Ni/Cu are combined with the nonmagnetic layer 51 to have perpendicular magnetization and have the crystalline orientation controlled. Using ferrite series oxides including yttrium iron garnett, manganese ferrite, and y-iron oxide for the ferromagnetic layer 52 enables it to reduce loss of a spin wave. Furthermore, using a magnetic semiconductor for the ferromagnetic layer 52 enhances the functionality thereof.

The antiferromagnetic layer 53 is used for fixing the magnetization direction of the ferromagnetic layer 52. As the antiferromagnetic layer 53, IrMn can be used, for example.

Conductive nonmagnetic materials are used for the electrode 54.

The conductive nonmagnetic materials include copper (Cu), gold (Au), silver (Ag), and aluminum (Al). Alternatively, the conductive nonmagnetic materials may be alloys of these elements, carbon nanotube, carbon nanowire, and graphene.

Measuring the resistance of the detection unit 50 allows it to detect a spin wave as follows. The magnetization direction of the ferromagnetic layer 52 is fixed in one direction; and a spin wave propagates through the magnetic wire 40 to induce a precession of the magnetization in the magnetic wire 40. The precession induces a change of the resistance of the detection unit 50, originating from MR (magnetoresistance).

Alternatively, the detection unit 50 may also be configured like the detection unit 60.

The detection unit 60 is provided with the nonmagnetic layer 51 on the magnetic wire 40, the ferromagnetic layer 52, the intermediate layer 61, the ferromagnetic layer 62, and the electrode 54.

The ferromagnetic layer 52 and the ferromagnetic layer 62 are antiferromagnetically coupled with each other through the intermediate layer 61. The antiferromagnetic coupling fixes the magnetization direction of the ferromagnetic layer 52 firmly.

The material of the ferromagnetic layer 62 is the same as that of the ferromagnetic layer 52.

Ru can be used for the intermediate layer 61, for example.

Figure 7A:
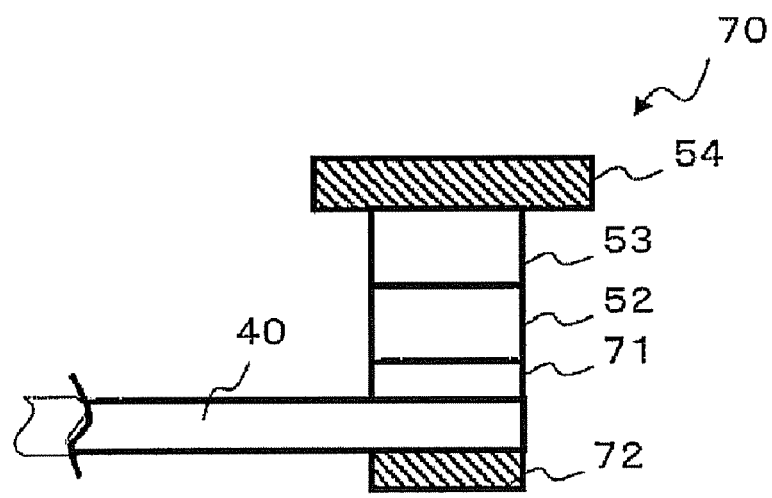
FIGS. 7A and 7B are views showing input units both connected to the magnetic wire.
Figure 7B:
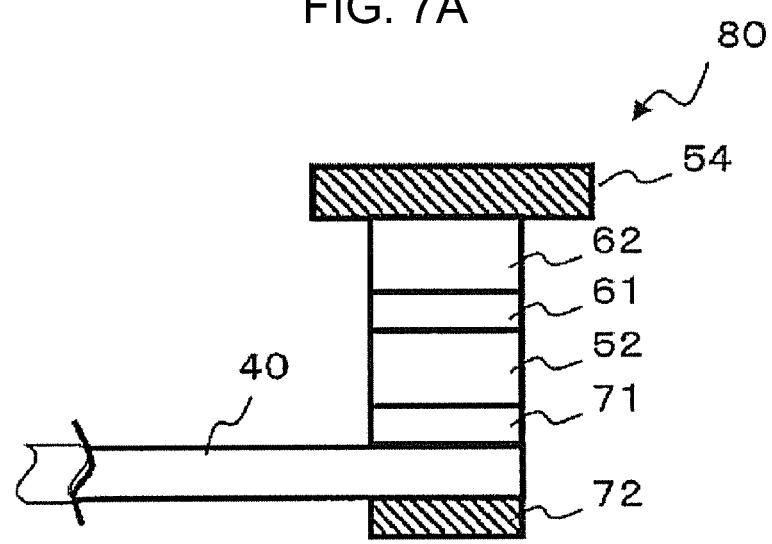

FIGS. 7A and 7B are views showing the input units (also referred to as spin-wave input units) 70 and 80 both being connected to the magnetic wire 40. FIG. 7A shows the input unit 70. FIG. 7B shows the input unit 80. The input units 70 and 80 are identical in operation-principle but different in configuration.

The input unit 70 is provided with a spacer layer 71 on the magnetic wire 40, the ferromagnetic layer 52, the antiferromagnetic layer 53, and the electrode 54. An electrode 72 is provided so that the magnetic wire 40 is between the electrode 72 and the spacer layer 71. Alternatively, a nonmagnetic layer may be provided between the magnetic wire 40 and the electrode 72.

Insulators or nonmagnetic metals are employed for the spacer layer 71.

The insulators include oxide, nitride, fluoride, and oxynitride; all of which contain at least one element selected from the group consisting of aluminum (Al), titanium (Ti), Zinc (Zn), zirconium (Zr), tantalum (Ta), cobalt (Co), nickel (Ni), silicon (Si), and magnesium (Mg). The insulators also include AlAs, GaN, AlN, ZnSe, ZnO, and MgO; all of which have a wide-energy gap.

The nonmagnetic metals include copper (Cu), gold (Au), silver (Ag), and aluminum (Al). Alternatively, the nonmagnetic metals also include alloys of these elements.

The material of the electrode 72 is the same as the material of the electrode 54.

A method to generate a spin wave in the magnetic wire 40 using the input unit 70 will be described below.

A current passes from the electrode 54 toward the electrode 72. At the time of the current passing through the input unit 70, spin torque acts on the magnetization of the magnetic wire 40 to induce precession of the magnetization thereinside. The precession propagates in the magnetic wire 40 induces a spin wave. Alternatively, a voltage may be applied between the electrode 54 and the electrode 72 to excite the precession.

Alternatively, the input unit 70 may be configured like the input unit 80.

The input unit 80 is provided with the spacer layer 71 on the magnetic wire 40, the ferromagnetic layer 52, the intermediate layer 61, the ferromagnetic layer 62, and the electrode 54.

The ferromagnetic layer 52 and the ferromagnetic layer 62 are antiferromagnetically coupled with each other through the intermediate layer 61. The antiferromagnetic coupling fixes the magnetization direction of the ferromagnetic layer 52 firmly.

The material of the ferromagnetic layer 62 is the same as that of the ferromagnetic layer 52.

Ru can be used for the intermediate layer 61, for example.

A manufacturing method of the magnetic memory element 100 will be described below.

Figure 8:
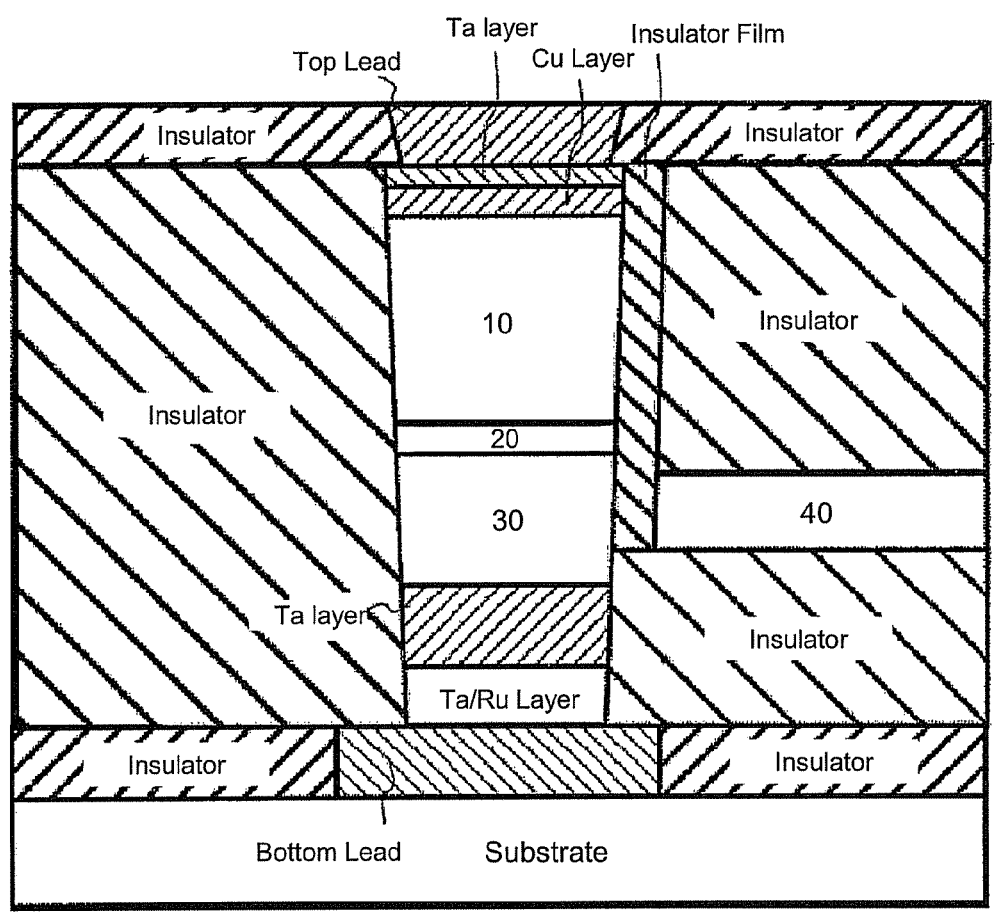
FIG. 8 is a view showing a laminated structure of the magnetic memory element on a bottom lead.

As shown in FIG. 8, the magnetic memory element 100 is provided on a metal multilayer film on a bottom lead. A Ta layer, a Ru layer, and a Cu layer are provided on the bottom lead. The metal multilayer film is provided also between a top lead and the reference layer 10. Another Cu layer and another Ta layer are provided on the reference layer 10.

Figure 9:
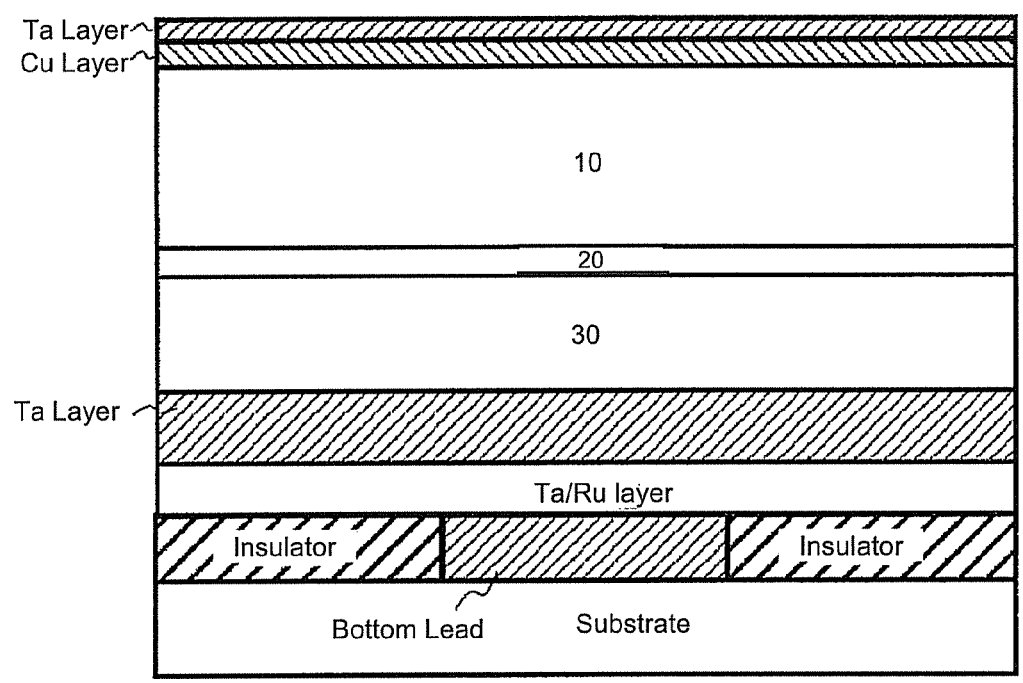
FIG. 9 is a view showing a laminated structure before processed for the magnetic memory element.

Firstly, an insulator layer is laminated on a substrate. Then the insulator layer is partially etched using a mask to expose a portion of the substrate surface. The bottom lead is provided on the exposed a portion of the substrate surface and then embedded. Secondly, the Ta layer, the Ru layer, the Cu layer, the free layer 30, the second intermediate layer 20, the reference layer 10, another Cu layer, and another Ta layer are laminated on the bottom lead in this order using a ultrahigh-vacuum sputtering system (see FIG. 9). FIG. 9 is a view showing a laminated structure before processed for the magnetic memory element.

Figure 10:
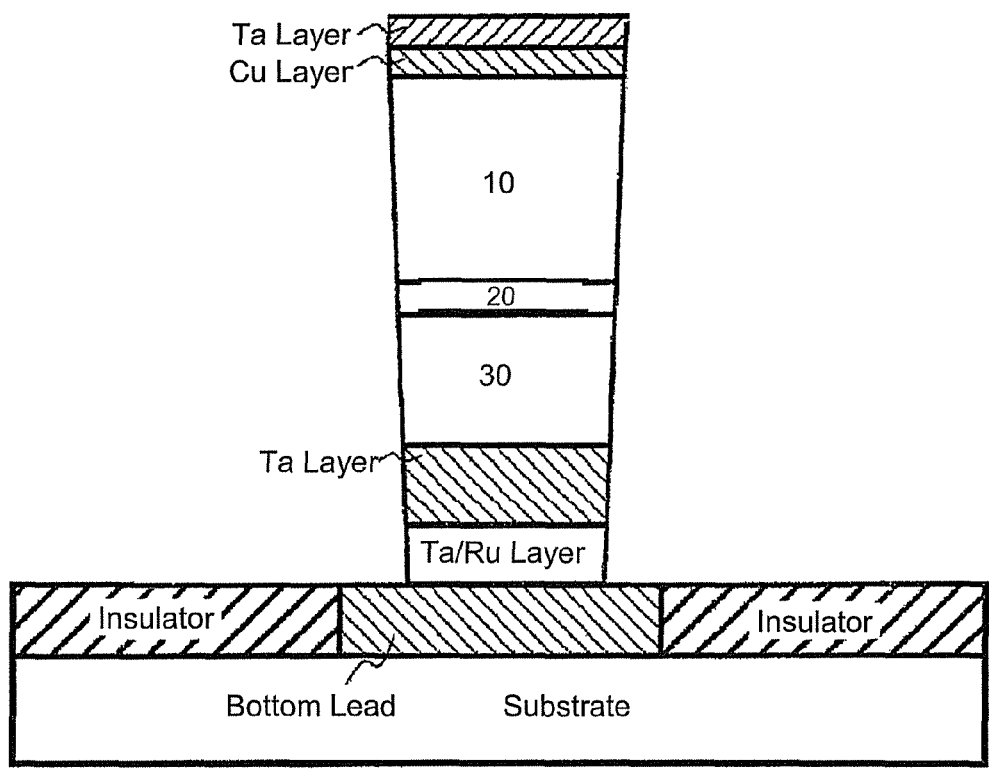
FIG. 10 is a view showing the magnetic memory element without the magnetic wire.

Thirdly, a negative resist is applied on the laminated structure. Only the resist on the area, covering the laminated structure to be left on the bottom lead, is exposed using EB exposure equipment. The resist is developed to leave the portion with which the laminated structure to be the magnetic memory cell 100 is covered. The laminated structure is etched by ion milling using the negative resist left as a pattern. At this time, the structure laminated on the bottom lead can be tapered by using a specific conditions of the ion milling process. Then the negative resist is removed (see FIG. 10). FIG. 10 is a view showing a magnetic memory cell after the processes mentioned above.

Figure 11:
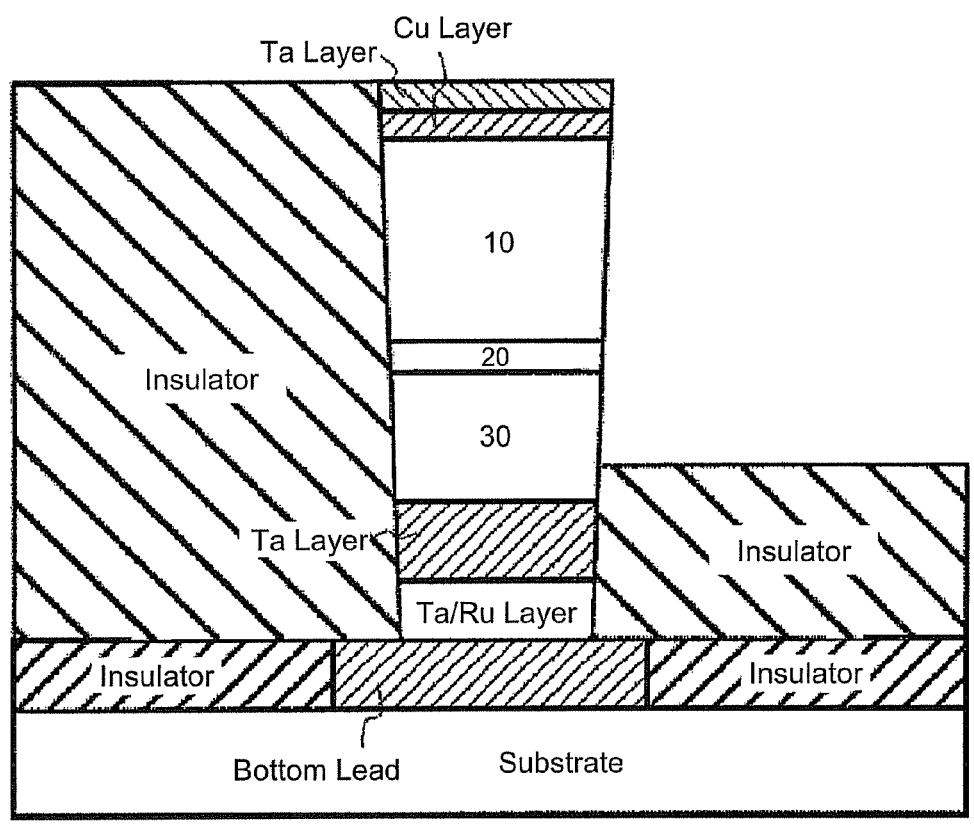
FIG. 11 is a view showing the magnetic memory element immediately before the magnetic memory element is provided with the magnetic wire.

Fourthly, another insulator layer is laminated on the top Ta layer and on the insulator layer just on the substrate using an ultrahigh-vacuum sputtering system. The resultant structure is planarized using chemical mechanical polishing (CMP). After CMP, a positive electron-beam resist is applied on the whole structure planarized by CMP. The positive resist is exposed using electron-beam exposure equipment and developed so that a portion of the positive resist just on the area, on which the magnetic wire 40 is provided, is removed. Only the portion of the Ta layer that is not covered with the resist is removed by ion milling. The upper insulator is etched by reactive ion etching using the Ta layer as a mask so that the top surface of the upper insulator etched is located lower than the top surface of the free layer 30 (see FIG. 11). FIG. 11 is a view showing a magnetic memory cell before the magnetic memory cell is provided with the magnetic wire.

Figure 12:
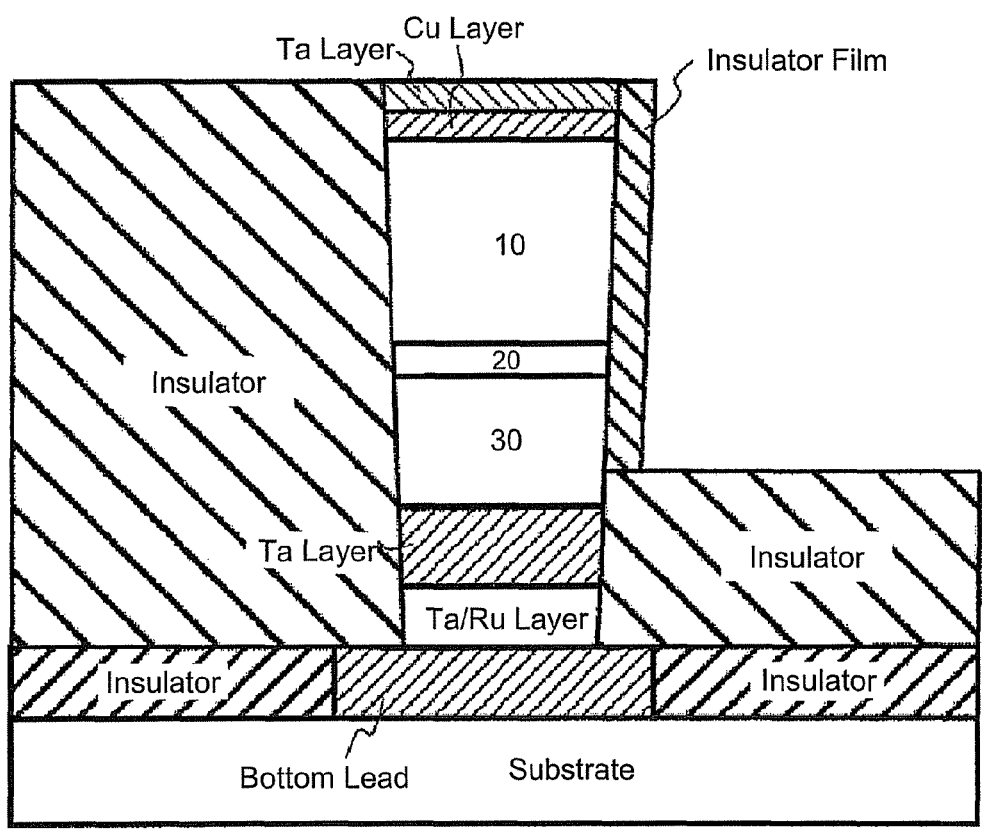
FIG. 12 is a view showing the magnetic memory element provided with an insulator film on its sidewall.

After residual compounds on the side wall of the laminated structure on the bottom lead are removed by ion milling, the wafer having the laminated structure, which has been sealed with an inert gas, is carried into an atomic layer deposition system. Then, an insulator film is deposited on the side wall of the laminated structure on the bottom lead. The other area other than the side wall is removed together with the positive electron-beam resist (see FIG. 12). FIG. 12 is a view showing the magnetic memory element provided with an insulator film on its sidewall.

Figure 13:
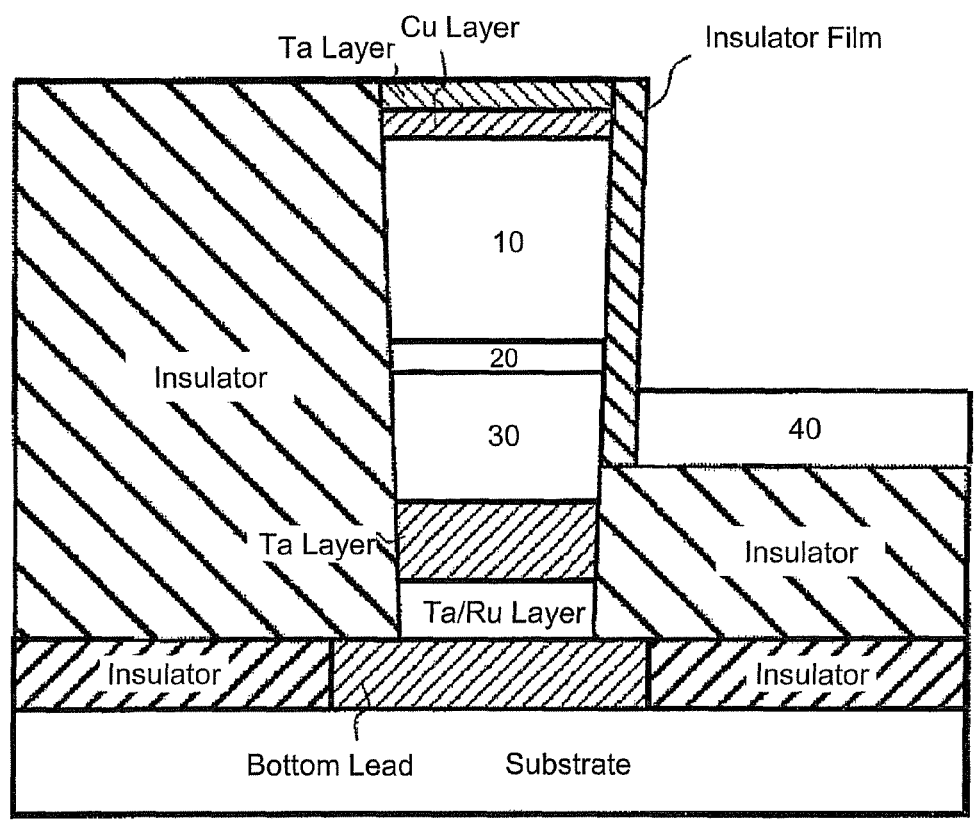
FIG. 13 is a view showing the magnetic memory element provided with the magnetic wire.

Fifthly, a magnetic layer is deposited on the Ta layer, the insulator, and the insulator film using an ultrahigh-vacuum sputtering system to form the magnetic wire 40. The resultant whole structure is planarized by CMP until the Ta layer appears on the top surface. Then a positive electron-beam resist is applied on the structure planarized. The positive electron-beam resist on the magnetic memory element 100 and on the neighboring portion thereof is exposed using EB exposure equipment and is developed. The resist left after the development is used as a mask to etch the magnetic layer by ion milling so that the top surface of the magnetic layer is aligned with the top surface of the free layer 30. After the ion milling, the resist is removed. Sixthly, a positive resist is applied on the Ta layer, the insulator film, and the magnetic layer, all of which are exposed to the air. A pattern of the positive resist is exposed to a KrF laser beam using KrF exposure equipment and is developed so that the pattern coats the magnetic memory element and the magnetic wire 40. The portion uncovered with the pattern is etched by ion milling (see FIG. 13). FIG. 13 is a view showing the magnetic memory element provided with the magnetic wire.

An insulator is deposited on the resultant whole substrate using an ultrahigh-vacuum sputtering system, which is followed by CMP for planarization. Finally, the top surface of the Ta layer is exposed using electron beam exposure equipment and ion milling. Subsequently, a metal layer is deposited thereon using an ultrahigh-vacuum sputtering system to provide a top lead (see FIG. 8).

Modification 1

FIGS. 14A and 14B are views showing modifications of the magnetic Memory element 100.

The magnetic memory element 200 shown in FIG. 14A differs from the magnetic memory element 100 in that the magnetic wire 40 faces not only the free layer 30, but also the intermediate layer 20. Even in such a magnetic memory element 200, an alternating magnetic field from the magnetic wire 40 acts on the magnetization of the free layer 30 so that the magnetic memory element 200 works as well as the magnetic memory element 100.

The magnetic memory element 300 shown in FIG. 14B differs from the magnetic memory element 100 in that the two magnetic wires 40 are provided. The two magnetic wires 40 can apply an alternating magnetic field to the free layer 30 more greatly than the single magnetic wire 40.

Modification 2

Figures 15A, 15B:
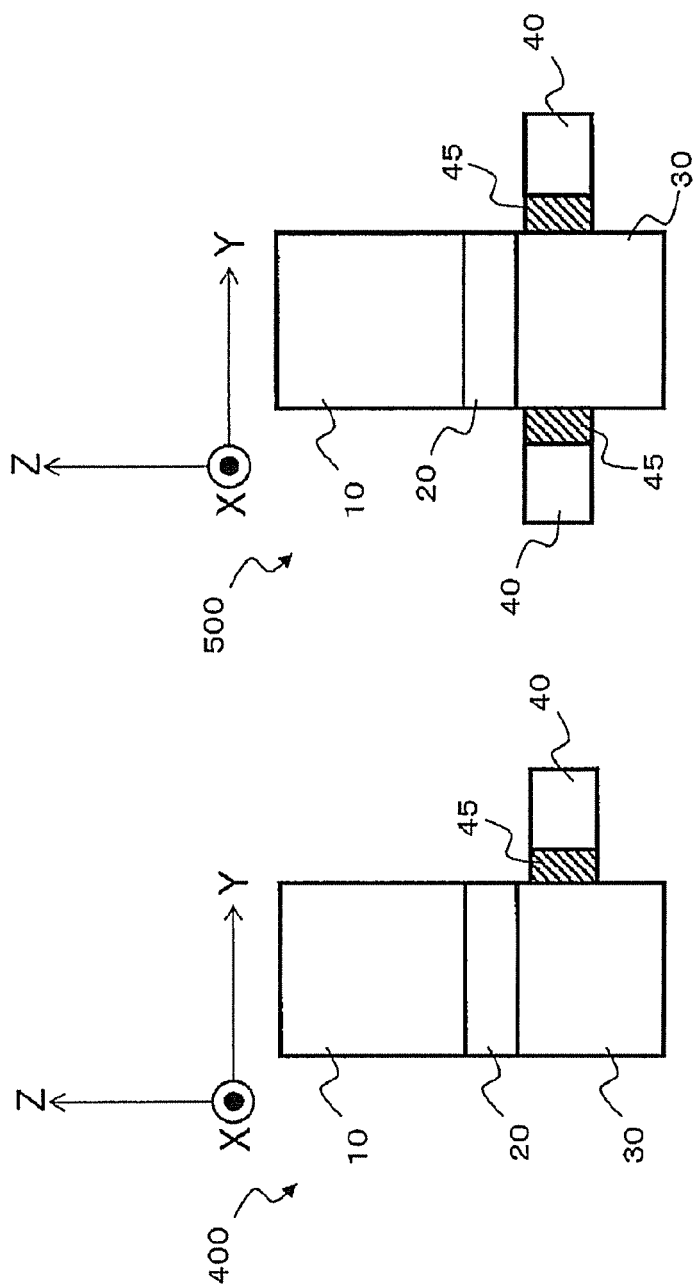
FIGS. 15A and 15B are views showing modifications of the magnetic memory element.

FIGS. 15A and 15B are views showing modifications of the magnetic memory element 100.

The magnetic memory element 400 shown in FIG. 15A differs from the magnetic memory element 100 in that an insulator film 45 is inserted between the magnetic wire 40 and the free layer 30. Such a configuration in the magnetic memory element 400 can reduce exchange coupling between the magnetic wire 40 and the free layer 30. Alternatively, the insulator film 45 may be replaced with a gap.

Examples of the insulator film 45 include MgO, alumina ($Al_2O_3$), and $SiO_2$.

The magnetic memory element 500 shown in FIG. 15B differs from the magnetic memory element 100 in that the two magnetic wires 40 are provided and the insulator film 45 is inserted between each of the magnetic wires 40 and the free layer 30. The two magnetic wires 40 can apply an alternate-current magnetic field to the free layer 30 more greatly than the single magnetic wire 40. The insulator film 45 can reduce exchange coupling between the magnetic wire 40 and the free layer 30.

Second Embodiment

Figure 16:
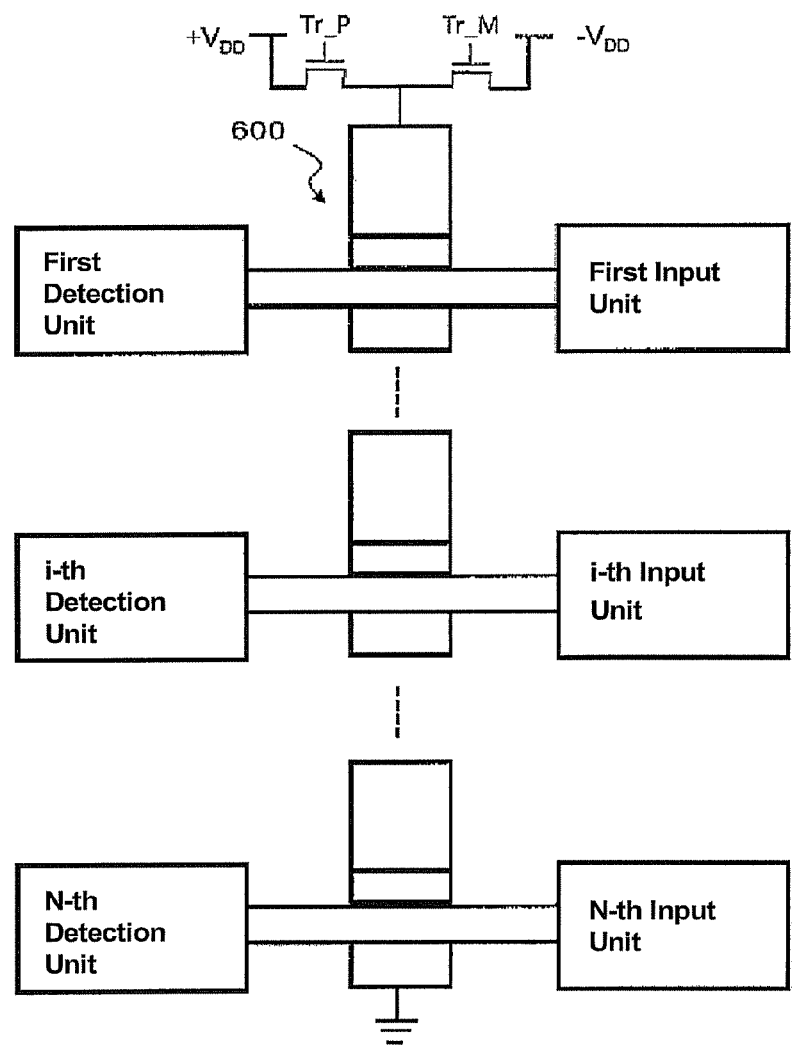
FIG. 16 is a view showing a magnetic memory apparatus in accordance with a second embodiment.

FIG. 16 is a view showing a magnetic memory apparatus 600.

The magnetic memory apparatus 600 includes two or more magnetic memory elements that are series-connected with each other via metal interconnects (referred to as electrodes). Here, the magnetic memory elements can be the magnetic memory elements 100, 200, 300, 400, and 500 described above. The magnetic memory elements are numbered as being the first, the i-th, and the N-th from the top (upper side) in FIG. 16. N and i are natural numbers in 1<i<N. N is the number of the magnetic memory element put at the bottom. The reference layer 10 of the first magnetic memory element is connected to the source terminal or the drain terminal of transistors Tr_P and Tr_M. One end of each magnetic wire 40 of the magnetic memory elements is connected to an input unit for generating a spin wave. The other end thereof is connected to a detection unit for detecting a spin wave. The free layer 30 of the N-th magnetic memory element is connected to a common terminal of an external circuit (not shown) via a metal interconnect.

Figure 17:
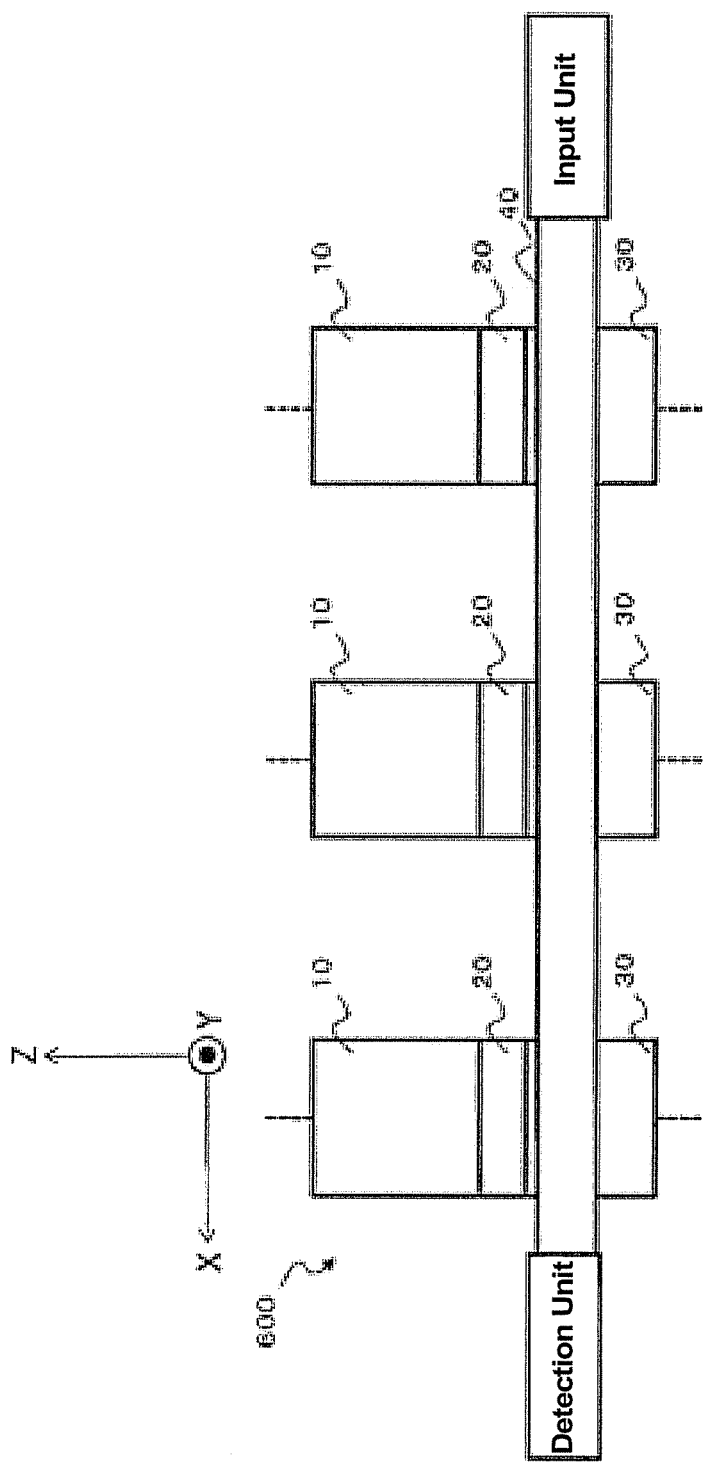
FIG. 17 is a view showing the magnetic memory apparatus where the magnetic memory elements are arranged in the x-axis direction and share a single magnetic wire.

Alternatively, the magnetic memory apparatus 600 may include two or more magnetic memory elements arranged in the x-axis direction, each of which shares the single magnetic wire 40, as shown in FIG. 17. FIG. 17 is a view showing the magnetic memory apparatus 600 where the magnetic memory elements are arranged in the x-axis direction and share the single magnetic wire. Such a configuration allows it to connect the input unit, the detection unit, and the external circuit just to one end or the other end of the single magnetic wire 40 and form the magnetic memory apparatus 600 with high-density arrangement of the magnetic memory elements.

Write-in operation of the magnetic memory apparatus 600 will be described below with reference to FIGS. 18A, 18B, 19A, and 19B.

For a convenience to understand the operation, the number of the magnetic memory elements is set as 10, expediently. The reference layer 10 of the first magnetic memory element is connected to Tr_P and Tr_M. Tr_P and Tr_M turn on/off a positive current $(+I_w)$ and a negative current $(-I_w)$, respectively. The input unit and the detection unit are connected to each magnetic wire 40 of the magnetic memory elements. For example, a coplanar line crossing magnetic wire 40 can be employed to detect a spin wave and is provided close to each magnetic wire 40. The common terminal of the external circuit is connected to the free layer 30 of the 10th magnetic memory element. If the magnetization of the free layer 30 is oriented upward and downward, "1" and "0" are determined to be assigned as data, respectively. In addition, the magnetization direction of the reference layer 10 is oriented upward. The magnetization directions of the reference layer 10 and the free layer 30 in each magnetic memory element are shown in FIGS. 18A and 19A.

FIGS. 18A and 18B show details of an operation in which a spin wave excitation in the magnetic wire 40 of the i-th magnetic memory element and turning on Tr_P to pass a positive current +Iw (Iw>0) therethrough change the status "0" of i-th magnetic memory element to "1". FIG. 18A shows a schematic view of the magnetic memory apparatus. FIG. 18B shows the timing with which a spin wave is excited.

FIGS. 19A and 19B show details of an operation in which a spin wave excitation in the magnetic wire 40 of the 10th magnetic memory element and turning on Tr_M to pass a negative current -Iw therethrough change the status "1" of 10-th magnetic memory element to "0". FIG. 19A shows a schematic view of the magnetic memory apparatus. FIG. 19B shows the timing with which a spin wave is excited.

Write-in operation to each magnetic memory element is realized by passing a current therethrough and excitation of a spin wave. Magnetization is reversed in the magnetic memory element involving the excitation of a spin wave more rapidly than in the magnetic memory element without the excitation. Regulating the time during which the current is passed therethrough allows it to select a cell, i.e., one of the magnetic memory elements, using a spin wave. The direction of the current determines the magnetization reversal of the free layer 30.

Turning on the transistor Tr_P passes a positive current from the first magnetic memory element to the 10th magnetic memory element. A spin wave is simultaneously excited so that the magnetization of the free layer 30 in the magnetic memory element having data "0" is changed to "1" (see the i-th cell in FIG. 18A). Meanwhile, passing a negative current therethrough excites a spin wave so that the magnetization of the free layer 30 in the magnetic memory element having data "1" is changed to "0" (see the 10th cell in FIG. 19A).

The direction of the passing current and either the presence or the absence of spin wave determine which the magnetic memory cell is selected for the magnetization reversal.

Figure 20B:
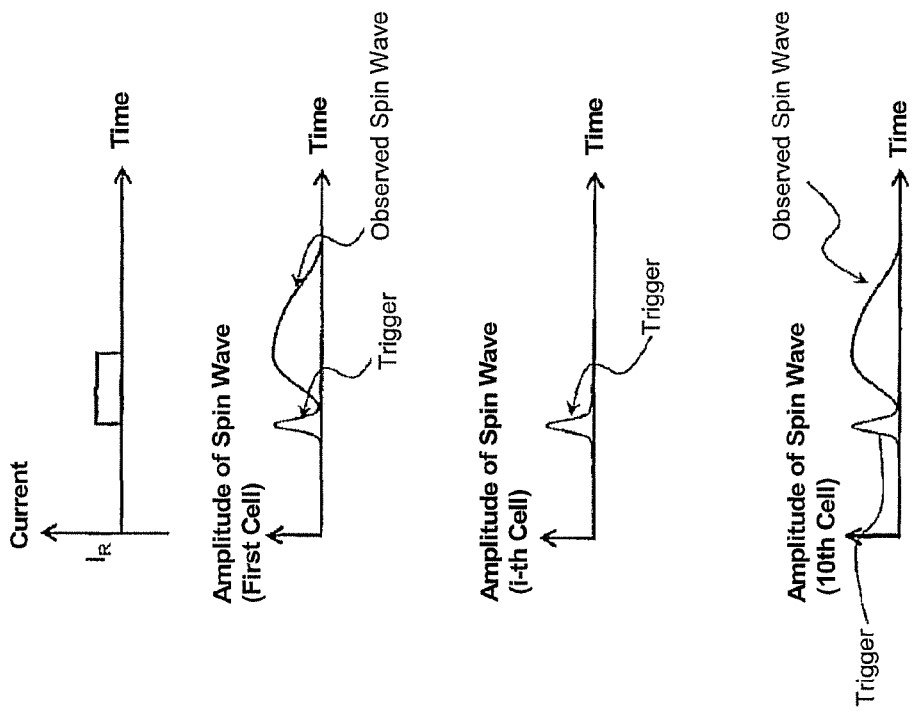
FIGS. 20A and 20B are views to explain read-out of the magnetic memory apparatus.

Read-out operation of the magnetic memory apparatus 600 will be described below with reference to FIGS. 20A and 20B.

Figure 20A:
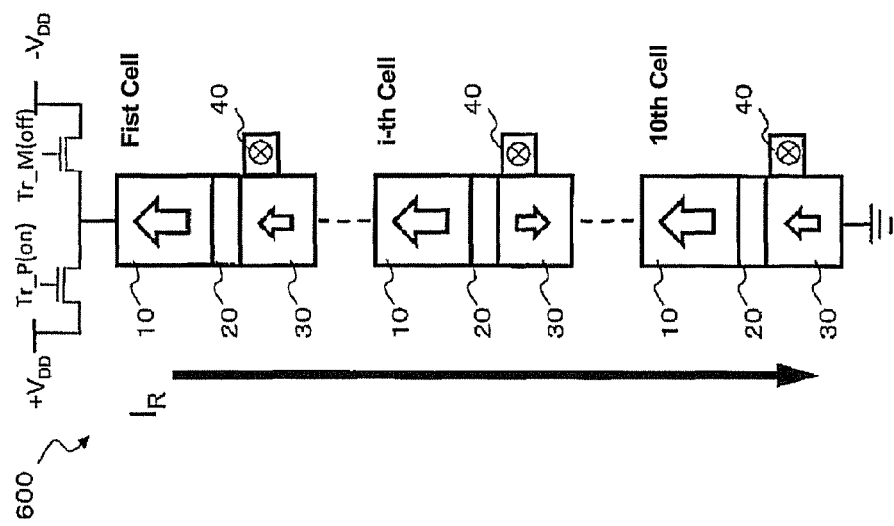

FIG. 20A is a schematic view showing the read-out operation. FIG. 20B shows the timing charts of the amplitude of a spin wave to be detected by each detection unit when both the first and 10th magnetic memory elements have data "0" whereas the i-th magnetic memory element has data "1."

Passing a read-out current $I_R$ ($I_R>0$) through the magnetic memory apparatus 600 induces a precession of the magnetization of the free layer 30. The read-out operation is realized by detection of the precession in the magnetic memory element. When the magnetic memory element in the parallel magnetization arrangement memorizes data "0", the passing positive current $I_R$ therethrough starts a precession of the magnetization of the free layer 30. An alternating magnetic field due to the precession induces (generates) a spin wave in the magnetic wire 40. The spin wave is detected using the detection unit provided to the magnetic wire 40, thereby enabling read-out operation of information. Meanwhile, when the magnetic memory element is in the anti-parallel magnetization arrangement and memorizes data "1", the magnetization does not precess in the free layer 30. Generating no precession shows that data "1" is memorized in the magnetic memory element. The time for which a current is passed through the magnetic memory elements for read-out operation is set shorter than the time for the magnetization reversal of the free layer 30. An excitation on the free layer 30 using a spin wave pulse via the magnetic wire 40, just after the current starts to be passed therethrough, can be a trigger to induce the precession. This spin wave trigger pulse can reduce the influence of thermal fluctuation of the magnetization in the free layer 30. The timing jitter related to thermal fluctuation is suppressed, thereby enabling it to easily read out information.

The negative current $-I_R$ (<0) also enables read-out operation. The negative current $-I_R$ (<0) induces magnetization precession in the magnetic memory element that is in the parallel magnetization arrangement and memorizes data "1" whereas the negative current does not induce it in the magnetic memory element that is in the anti-parallel magnetization arrangement and memorizes data "0." Using the negative current exchanges the above-mentioned relation between the memorized data and the presence or absence of a spin wave that is outputted from the magnetic memory element.

While certain embodiments of the invention have been described, these embodiments have been presented by way of example only, and are not intended to limit the scope of the inventions. Indeed, the novel elements and apparatuses described herein may be embodied in a variety of other forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

What is claimed is:

1. A magnetic memory element comprising:
   a first magnetic layer whose magnetization direction is fixed;
   a second magnetic layer whose magnetization direction is variable;

a first intermediate layer between the first magnetic layer and the second magnetic layer;

a first magnetic wire extending in a first direction perpendicular to a direction connecting from the first magnetic layer to the second magnetic layer, the first magnetic wire being adjacent to the second magnetic layer;

a first input unit provided at one end of the first magnetic wire;

a first detection unit provided at another end of the first magnetic wire, wherein write-in operation is realized by propagating a first spin wave, generated by using the first input unit, through the first magnetic wire and by passing a first current from the first magnetic layer toward the second magnetic layer so that magnetization of the second magnetic layer is reversed; and read-out operation is realized by passing a second current from the first magnetic layer toward the second magnetic layer, the second current causing magnetization of the second magnetic layer to precess, generating a second spin wave in the first magnetic wire, and propagating the second spin wave through the first magnetic wire so that the second spin wave is detected in the first detection unit.

2. The element according to claim 1, further comprising a first insulator layer between the second magnetic layer and the first magnetic wire.

3. The element according to claim 2, further comprising:
a second magnetic wire extending in the first direction and being adjacent to the second magnetic layer so that the second magnetic layer is between the first magnetic wire and the second magnetic wire;
a second input unit provided at one end of the second magnetic wire;
and
a second detection unit provided at another end of the second magnetic wire,
wherein
write-in operation is realized by propagating a third spin wave, generated by using the second input unit, through the second magnetic wire and by passing a third current from the first magnetic layer toward the second magnetic layer so that the magnetization of the second magnetic layer is reversed; and
read-out operation is realized by passing a fourth current from the first magnetic layer toward the second magnetic layer, the fourth current causing the magnetization of the second magnetic layer to precess, generating a fourth spin wave in the second magnetic wire, and propagating the fourth spin wave through the second magnetic wire so that the fourth spin wave is detected in the second detection unit.

4. The element according to claim 3, further comprising a second insulator layer between the second magnetic layer and the second magnetic wire.

5. The element according to claim 2, further comprising:
a second magnetic wire extending in the first direction and being adjacent to the second magnetic layer so that the second magnetic layer is between the first magnetic wire and the second magnetic wire;
a second input unit provided at one end of the second magnetic wire; and
a second detection unit provided at another end of the second magnetic wire,
wherein write-in operation is realized by propagating a third spin wave, generated by using the second input unit through the second magnetic wire and by passing a third current from the second magnetic layer toward the first magnetic layer so that the magnetization of the second magnetic layer is reversed; and
read-out operation is realized by passing a fourth current from the second magnetic layer toward the first magnetic layer, the fourth current causing the magnetization of the second magnetic layer to precess, generating a fourth spin wave in the second magnetic wire, and propagating the fourth spin wave through the second magnetic wire so that the fourth spin wave is detected in the first detection unit.

6. A magnetic memory apparatus comprising two or more magnetic memory elements,
the magnetic memory elements each including:
a first magnetic layer whose magnetization direction is fixed;
a second magnetic layer whose magnetization direction is variable;
a first intermediate layer between the first magnetic layer and the second magnetic layer;
a first magnetic wire, the first magnetic wire extending in a second direction perpendicular to a first direction and being adjacent to the second magnetic layer, the first direction being perpendicular to both the first magnetic layer and the second magnetic layer;
a first input unit provided at one end of the first magnetic wire;
a first detection unit provided at another end of the first magnetic wire,
wherein
write-in operation is realized by propagating a first spin wave through the first magnetic wire and by passing a first current from the first magnetic layer toward the second magnetic layer so that magnetization of the second magnetic layer is reversed; and
read-out operation is realized by passing a second current from the first magnetic layer toward the second magnetic layer, the second current causing the magnetization of the second magnetic layer to precess, generating a second spin wave in the first magnetic wire, and propagating the second spin wave through the first magnetic wire so that the second spin wave is detected in the first detection unit.

7. A magnetic memory element comprising:
a first magnetic layer whose magnetization direction is fixed;
a second magnetic layer whose magnetization direction is variable;
a first intermediate layer between the first magnetic layer and the second magnetic layer;
a first magnetic wire extending in a first direction perpendicular to a direction connecting from the first magnetic layer to the second magnetic layer, the first magnetic wire being adjacent to the second magnetic layer;
a first input unit provided at one end of the first magnetic wire;
a first detection unit provided at another end of the first magnetic wire,
wherein
write-in operation is realized by propagating a first spin wave, generated by using the first input unit, through the first magnetic wire and by passing a current from the second magnetic layer toward the first magnetic layer so that magnetization of the second magnetic layer is reversed; and read-out operation is realized by passing a second current from the second magnetic layer toward the first magnetic layer, the current causing the magnetization of the second magnetic layer to precess, generating a second spin wave in the first magnetic wire, and propagating the second spin wave through the first magnetic wire so that the second spin wave is detected in the first detection unit.

* * * * *